United States Patent
Terai

(10) Patent No.: US 9,871,746 B2
(45) Date of Patent: Jan. 16, 2018

(54) TRANSMISSION APPARATUS AND TRANSMISSION METHOD

(71) Applicant: KYOCERA Corporation, Kyoto (JP)

(72) Inventor: Ryota Terai, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 89 days.

(21) Appl. No.: 14/770,682

(22) PCT Filed: Feb. 26, 2014

(86) PCT No.: PCT/JP2014/001030
§ 371 (c)(1),
(2) Date: Aug. 26, 2015

(87) PCT Pub. No.: WO2014/132643
PCT Pub. Date: Sep. 4, 2014

(65) Prior Publication Data
US 2016/0014045 A1   Jan. 14, 2016

(30) Foreign Application Priority Data

Feb. 26, 2013 (JP) .................................. 2013-036218

(51) Int. Cl.
*H04L 12/911* (2013.01)
*H02J 13/00* (2006.01)
(Continued)

(52) U.S. Cl.
CPC ........... *H04L 47/821* (2013.01); *G01D 4/004* (2013.01); *H02J 13/001* (2013.01); *H04L 47/11* (2013.01);
(Continued)

(58) Field of Classification Search
None
See application file for complete search history.

(56) References Cited

U.S. PATENT DOCUMENTS 7,725,094 B2 * 5/2010 Chary .................. G06F 1/3203
455/343.2
2007/0232230 A1 * 10/2007 Anke ...................... H04L 49/90
455/39

(Continued)

FOREIGN PATENT DOCUMENTS

JP   H02-199949 A   8/1990
JP   2000-216932 A   8/2000

(Continued)

OTHER PUBLICATIONS

International Search Report dated Jun. 3, 2014, issued for International Application No. PCT/JP2014/001030.
Written Opinion of the International Searching Authority issued by Japan Patent Office and corrected version thereof for International Application No. PCT/JP2014/001030.

*Primary Examiner* — Faruk Hamza
*Assistant Examiner* — Thinh Tran
(74) *Attorney, Agent, or Firm* — Procopio Cory Hargreaves and Savitch LLP

(57) ABSTRACT

A transmission apparatus (101) includes an acquisition unit (121) for acquiring a power consumption of each of a plurality of power loads; a communication unit (125) for transmitting data associated with the power consumption to a server via a network; and a controller (127) for acquiring a congestion degree of the network, wherein the controller (127) determines a priority of the data based on the congestion degree and controls the communication unit (125) to transmit the data in priority order.

10 Claims, 13 Drawing Sheets

(51) Int. Cl.
  H04L 12/801    (2013.01)
  H04L 12/851    (2013.01)
  H04L 12/927    (2013.01)
  G01D 4/00      (2006.01)
  G01R 22/06     (2006.01)
  G01R 22/10     (2006.01)

(52) U.S. Cl.
  CPC ........ H04L 47/2433 (2013.01); H04L 47/805 (2013.01); *G01R 22/063* (2013.01); *G01R 22/10* (2013.01); *Y02B 90/242* (2013.01); *Y04S 10/40* (2013.01); *Y04S 20/322* (2013.01); *Y04S 20/46* (2013.01)

(56) References Cited

U.S. PATENT DOCUMENTS

| | | | |
|---|---|---|---|
| 2008/0297312 A1* | 12/2008 | Moshfeghi | H04L 47/10 340/10.1 |
| 2010/0191862 A1* | 7/2010 | Forbes, Jr. | G06Q 10/00 709/240 |

FOREIGN PATENT DOCUMENTS

| | | |
|---|---|---|
| JP | 2004-226223 A | 8/2004 |
| JP | 2011-077713 A | 4/2011 |
| JP | 2011-188620 A | 9/2011 |
| WO | 2012/056551 A1 | 5/2012 |

\* cited by examiner

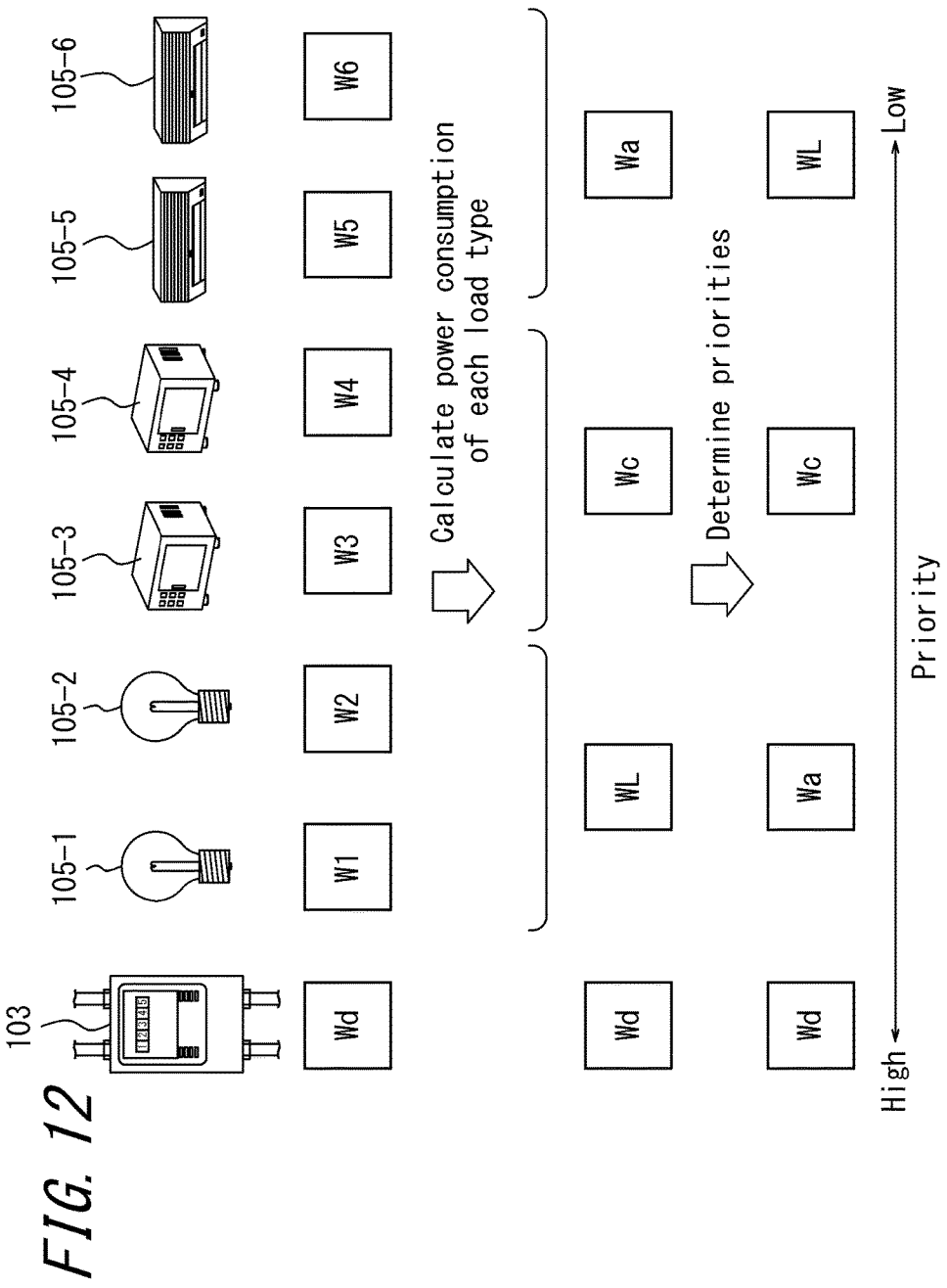

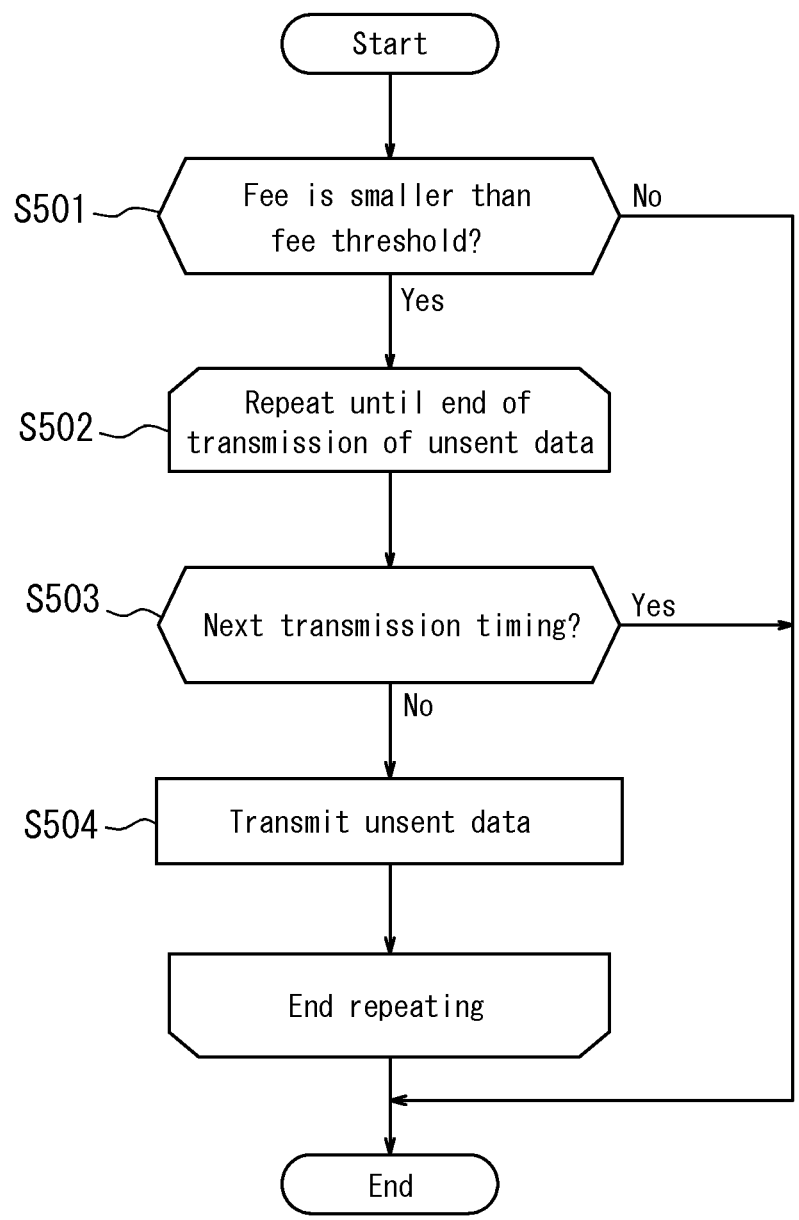

TRANSMISSION APPARATUS AND TRANSMISSION METHOD

CROSS REFERENCE TO RELATED APPLICATION

This application claims priority to and the benefit of Japanese Patent Application No. 2013-036218 (filed on Feb. 26, 2013), the entire contents of which are incorporated herein by reference.

TECHNICAL FIELD

This disclosure relates to a transmission apparatus and a transmission method.

BACKGROUND

In recent years, owing to a concern for power shortage and a request for global environmental protection, each store, household, building, and the like (hereinafter abbreviated as each store and the like) have been asked for power saving. A power demand increases especially in summer time and winter time, and a power consumption by each store and the like sometimes exceeds a contract demand. As such, in order to effectively save power and prevent the power consumption from exceeding the contract demand, what is called BEMS (Building and Energy Management System) that monitors the power consumption of each store and the like and controls the power consumption of various electrical products (hereinafter, referred to as a power load) has been proposed. In the BEMS, a power sensor detects the power consumption of each power load and transmits data associated with the detected power consumption to, for example, a remotely located server. Then, the server, while monitoring the power consumption, transmits a control signal according to the power consumption to each power load, thereby efficiently reducing the power consumption of each power load.

Here, when an amount of data from a power sensor increases in proportion to an increase in the number of power loads, a traffic load for data transmission to the server and a server load also increase. As a result, the data acquired by the power sensor are not transmitted to the server within a predetermined time, inhibiting control in accordance with a current power consumption.

As such, there has been proposed, for example, a method of reducing the amount of data when the traffic load is increased and sending a reduced amount of data (for example, see PLT 1). According to the method described in JP 2000-216932 A, the transmission apparatus, prior to the data transmission to a reception apparatus (a server), acquires information about the traffic load on a network. Then, when the traffic load according to the information thus acquired is greater than a predetermined value, the transmission apparatus changes a data attribute (resolution and the like) in order to reduce the amount of the data and transmits the data in a reduced amount.

SUMMARY

Technical Problem

However, since the transmission apparatus according to JP 2000-216932 A changes the attribute of entire data to be transmitted, the entire data becomes rough due to the reduction in the amount thereof, and quality of the data becomes deteriorated overall. Also, even when the transmission apparatus changes the attribute of some data alone, since there is no consideration about weighting of the data, there is a risk to change the attribute of high priority data alone. In this case, a reception apparatus is unable to obtain accurate information from the high priority data.

Accordingly, it could be helpful to provide, in consideration of the above issues, a transmission apparatus and a transmission method those capable of efficiently transmitting high priority data.

Solution to Problem

In order to solve the above issues, a transmission apparatus according to a first aspect includes:

an acquisition unit for acquiring a power consumption of each of a plurality of power loads;

a communication unit for transmitting data associated with the power consumption to a server via a network; and a controller for acquiring a congestion degree of the network, wherein the controller determines a priority of the data based on the congestion degree and controls the communication unit to transmit data in priority order.

A transmission apparatus according to a second aspect is the transmission apparatus according to the first aspect, wherein the controller deals with a total power consumption as main data and gives the main data a highest priority.

A transmission apparatus according to a third aspect is the transmission apparatus according to the second aspect, wherein when the congestion degree is equal to or higher than a first congestion threshold, the controller, based on the power consumption, calculates a power consumption of each power distribution type of each distribution system in a power grid as sub-data, and gives the sub-data a second highest priority next to the main data.

A transmission apparatus according to a fourth aspect is the transmission apparatus according to the third aspect, wherein, when the congestion degree is lower than a first congestion threshold and higher than a second congestion threshold that is smaller than the first congestion threshold, the controller compares the total power consumption with a power threshold and, when the total power consumption is greater than the power threshold, deals with the power consumption as the sub-data, gives the sub-data a second highest priority next to the main data, and within the sub-data, gives a higher propriety to the power consumption in proportion to an instantaneous value or a change amount thereof.

A transmission apparatus according to a fifth aspect is the transmission apparatus according to the fourth aspect, wherein, when the total power consumption is less than the power threshold, the controller based on the power consumption, calculates a phase power consumption of each voltage line with the same ground voltage as the sub-data, compares a power difference between the phase power consumptions with a power difference threshold, and when the power difference is equal to or greater than the power difference threshold, gives the sub-data a second highest priority next to the main data.

A transmission apparatus according to a sixth aspect is the transmission apparatus according to the fifth aspect, wherein, when the power difference is smaller than the power difference threshold, the controller based on the power consumption, calculates the power consumption of each load type of each power load type as the sub-data, gives the sub-data a second highest priority next to the main data, and within the sub-data, gives a higher priority to the power consumption of each load type in proportion to the instantaneous value thereof.

A transmission apparatus according to a seventh aspect is the transmission apparatus according to the fourth aspect, wherein, when the total power consumption is smaller than the power threshold, the controller compares a transmission fee of the network with a fee threshold, and when the transmission fee is equal to or greater than the fee threshold, calculates, based on the power consumption, the power consumption of each power distribution system in the power gird and gives the sub-data a second highest priority next to the main data.

A transmission apparatus according to an eighth aspect is the transmission apparatus according to the first aspect, wherein the controller deals with a power consumption different from the sub-data among the acquired power consumptions as unsent data, and gives the unsent data a third highest priority next to the sub-data.

A transmission apparatus according to a ninth aspect is the transmission apparatus according to the eighth aspect, wherein the controller compares the transmission fee of the network with the fee threshold, and when the transmission fee is equal to or greater than the fee threshold, controls the communication unit not to transmit the unsent data.

A transmission apparatus according to a tenth aspect is the transmission apparatus according to the fourth aspect, wherein, when the congestion degree is lower than the second congestion threshold, the controller deals with the power consumption as the sub-data, gives the sub-data a second highest priority next to the main data, and within the sub-data, gives each power consumption the same priority.

A transmission apparatus according to an eleventh aspect is the transmission apparatus according to the second aspect, wherein the communication unit receives, from the server, a signal for specifying data to be transmitted by the transmission apparatus, and the controller gives the data to be transmitted a second highest priority next to the main data.

Although the apparatus is used as the solution to problem in the above description, a method, a program, and a storage medium storing the program those substantially correspond to the apparatus may substantialize the present invention and thus are included in the scope of the present disclosure.

For example, a power control method according to a twelfth aspect substantializing the present disclosure is a transmission method of a transmission apparatus for transmitting data to a server via a network, wherein the transmission method includes:

a step of acquiring a power consumption of each of a plurality of power loads;

a step of acquiring a congestion degree of the network;

a step of determining a priority of the data associated with the power consumption based on the congestion degree, and a step of transmitting data in priority order.

Advantageous Effect

According to the transmission apparatus and the transmission method as described above, high priority data may be efficiently transmitted.

BRIEF DESCRIPTION OF THE DRAWINGS

In the accompanying drawings:

FIG. 12 is a diagram illustrating a power consumption of each load type according to one embodiment; and FIG. 13 is a flowchart illustrating an unsent data transmission operation of the transmission apparatus according to one embodiment.

DETAILED DESCRIPTION

Hereinafter, a transmission apparatus according to one embodiment will be described with reference to the accompanying drawings.

Figure 1:
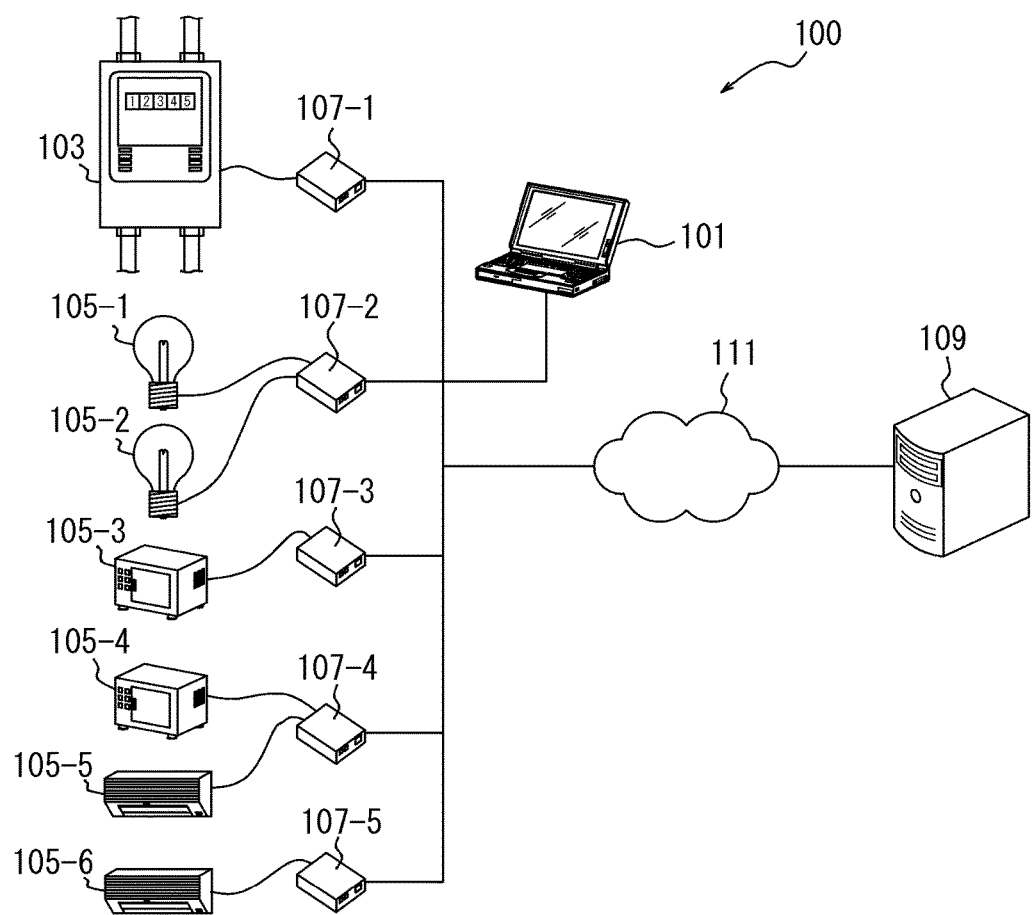
FIG. 1 is a schematic block diagram of a power control system according to one embodiment.

FIG. 1 is a diagram illustrating a schematic configuration of a power control system according to one embodiment. A power control system 100 includes a transmission apparatus 101, a power meter 103, a plurality of power loads 105 (105-1 to 105-6), a plurality of sensors 107 (107-1 to 107-5), and a server 109.

The transmission apparatus 101 acquires (collects) a power consumption of each power load and transmits data associated with the power consumption to a server 109 via a network 111. The transmission apparatus 101 includes a computer that performs an operation described below. The power meter 103 is connected to a main breaker and measures the power consumption of all of the power loads 105 (hereinafter, referred to as a total power consumption). The power loads 105 are a variety of electrical products those consume power and may be, for example, a light, a microwave, an air conditioner, a TV (a television receiver), a refrigerator, and the like. The power loads 105 are connected to a branch breaker (MCCB) connected to the main breaker. Although FIG. 1 illustrates six power loads 105, the present disclosure is not limited thereto but the number of power loads 105 may be two or more.

The sensor 107 converts the power consumption into data the transmission apparatus 101 may handle and transmits the data thereto. Also, the sensor 107 may transmit, to the transmission apparatus 101, in addition to a value of the power consumption, information about the power load corresponding to the power consumption and information about a distribution system described below that supplies the power for the power consumption. The sensor 107-1 is connected to the power meter 103 and acquires the total power consumption. The sensors 107-2 to 107-5 are connected to the power loads 105-1 to 105-6, respectively, and acquire the power consumptions thereof.

The server 109, based on the data associated with the power consumption that have been received, determines how to reduce the power consumption and transmits a control signal for instructing a reduction in the power consumption to the power load 105. The server 109 may be constituted by using, for example, a BEMS controller and the like. The data associated with the power consumption include data of the power consumption itself of each power load, data obtained by summing up a plurality of power consumptions, and the like. The network 111 is a circuit for connecting the transmission apparatus 101, the sensors 107, and the server 109 and may be, for example, LAN (Local Area Network), WAN (Wide Area Network), and the like.

Figure 2:
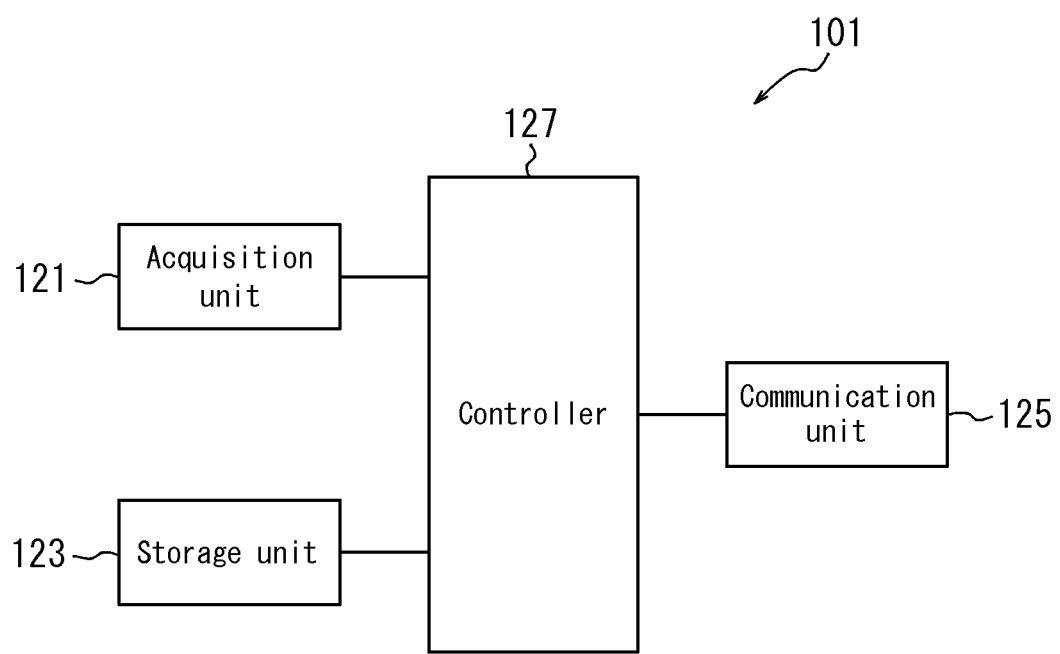
FIG. 2 is a functional block diagram illustrating a schematic configuration of a transmission apparatus according to one embodiment.

FIG. 2 is a functional block diagram illustrating a schematic configuration of the transmission apparatus according to one embodiment. The transmission apparatus 101 includes an acquisition unit 121, a storage unit 123, a communication unit 125, and a controller 127. The acquisition unit 121, the storage unit 123, and the communication unit 125 are connected to the controller 127.

The acquisition unit 121 acquires, from the sensor 107, the power consumption of each of a plurality of power loads 105 and serves as a communication unit for communicating with, for example, the sensor 107. The transmission apparatus 101 may include the sensor 107 therein. In this case, the acquisition unit 121 may be the sensor itself or an ADC (Analog to Digital Converter) for converting an analog signal from the sensor into a digital signal the controller 127 may handle. Although in FIG. 2 the communication unit 125 described below for communicating with the server 109 and the acquisition unit 121 are represented by individual functional blocks, when the acquisition unit 121 serves as the communication unit, the acquisition unit 121 and the communication unit 125 do not need to be substantialized by individual hardware. The transmission apparatus 101 may have one communication unit having both a function of the acquisition unit 121 and a function of the communication unit 125.

The storage unit 123 stores information about various thresholds and the like described below and also functions as a work memory. The storage unit 123 is constituted by using, for example, a memory or an HDD. The communication unit 125 transmits the data associated with the power consumption to the server 109 via the network 111.

The controller 127 controls and manages the entire transmission apparatus 101 including each functional block thereof. The controller 127 may be constituted by using software executed by any appropriate processor such as CPU (Central Processing Unit) or a dedicated processor specialized for each operation (for example, DSP (Digital Signal Processor)).

The controller 127 acquires a congestion degree of the network 111 and, based thereon, determines a priority of the data associated with the power consumption. The congestion degree of the network 111 corresponds to an amount of data currently being transmitted in the network 111. The amount of data that may be transmitted by the transmission apparatus 101 decreases in reverse proportion to the congestion degree, and a throughput also decreases.

In proportion to the congestion degree, time necessary for the data from the transmission apparatus 101 to reach the server 109 is prolonged, or sometimes the data fails to reach. Therefore, the controller 127 determines the priority of the data associated with the power consumption and controls the communication unit 125 to transmit the data in priority order. The controller 127, in order to determine the priority, uses a congestion threshold as an index for evaluation of the congestion degree.

The congestion degree is, for example, transmission delay time or a transmission amount those increase in proportion to a congestion factor of the network 111. The transmission delay time is represented by, for example, a time (RTT: Round-Trip Time) taken by the communication unit 125 from transmission of data to reception of a response signal (an ACK signal or a NACK signal) in response to the data from the server 109. The data transmitted to the server 109 in order to measure the transmission delay time may be either the data associated with the power consumption or test data for the measurement. According to the present embodiment, hereinafter, the congestion degree corresponds to the RTT, and the congestion threshold described above corresponds to a time threshold for the RTT. A further detail of a method of determining the priority will be described below with reference to FIG. 3.

Figure 3:
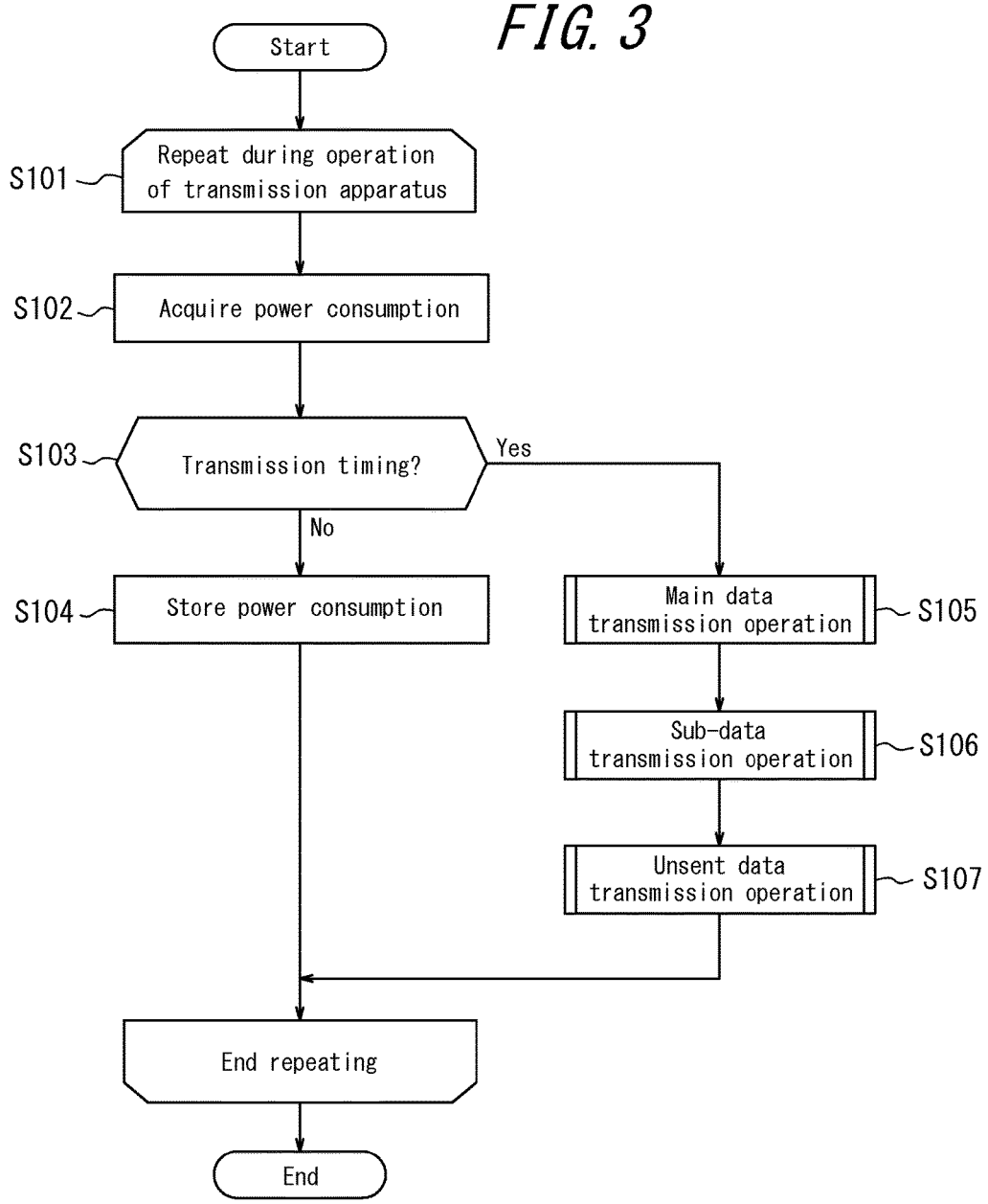
FIG. 3 is a flowchart illustrating an operation of the transmission apparatus according to one embodiment.

Next, the transmission method of the transmission apparatus 101 will be described with reference to FIG. 3. FIG. 3 is a flowchart illustrating an operation of the transmission apparatus according to one embodiment. Note that various thresholds mentioned below may be appropriately determined according to a transmission line capacity, a contract demand, and the like.

Figure 4:
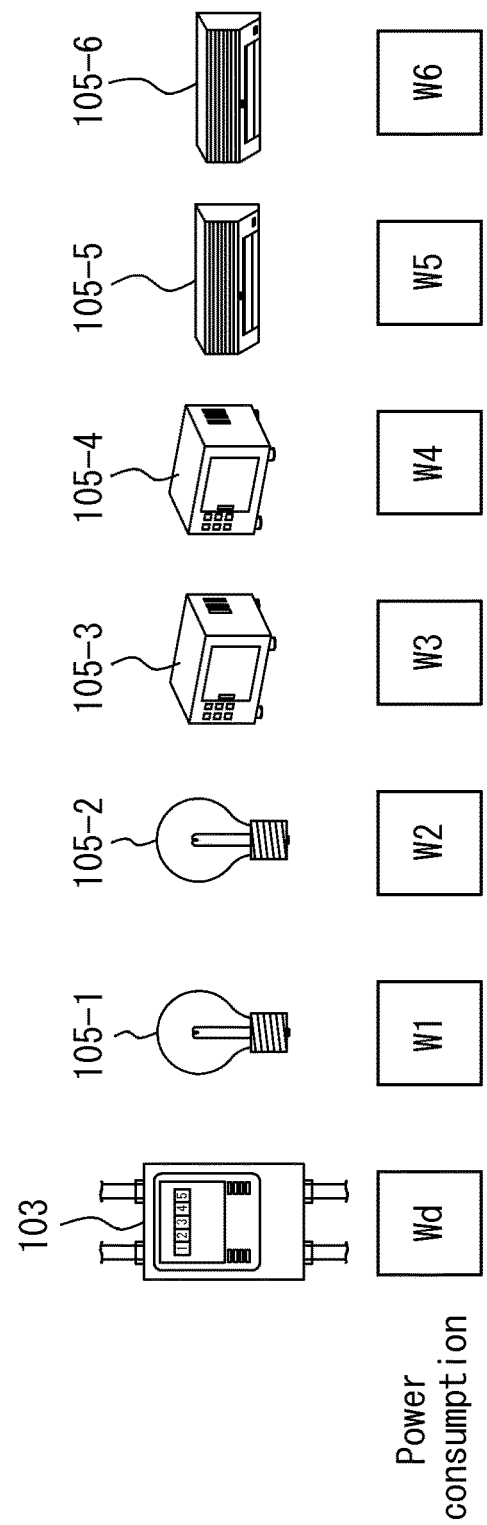
FIG. 4 is a diagram illustrating power consumptions according to one embodiment.

First, the transmission apparatus 101, during an operation thereof by a repeating operation at step S101, carries out operations at step S102 to S107 described below. First, the acquisition unit 121, periodically or irregularly, acquires the power consumption from the sensor 107 and transmits the power consumption to the controller 127 (step S102). In the present embodiment, as illustrated in FIG. 4, a total power consumption indicated by the power meter 103 is represented by Wd, and the power consumptions of the power loads 105-1 to 105-6 correspond to W1 to W6, respectively.

The controller 127 may control the communication unit 125 to transmit, at predetermined transmission timing, the data associated with the power consumptions Wd and W1 to W6 (step S103). The transmission timing may be periodic or irregular and may serve as timing to notify the server 109 as required to receive a BEMS subsidy. In order to achieve a subsidiary rate at ½, a notification within 10 minutes is required. Therefore, the transmission timing comes at intervals of 10 minutes or shorter.

When it is not at the transmission timing (No at step S103), the controller 127 may store the power consumptions Wd and W1 to W6 those having been acquired to the storage unit 123 (step S104). At this time, the controller 127 may store the power consumption in relation to time, thereby allowing identification of the power consumption in a history.

When it is at the transmission timing (Yes at step S103), the controller 127 determines the priorities of the power consumptions Wd and W1 to W6. The controller 127 selects main data and sub-data from the data associated with the power consumption and gives the main data a highest priority and the sub-data a second highest priority next to the main data. Also, the controller 127 deals with a power consumption other than the sub-data out of the power consumptions Wd and W1 to W6, i.e., the power consumption that has not been selected as the sub-data as unsent data and gives the unsent data a third highest priority next to the sub-data. Thereby, the controller 127 carries out a main data transmission operation, a sub-data transmission operation, and an unsent data transmission operation, in the stated order (step S105 to S107).

Figure 5:
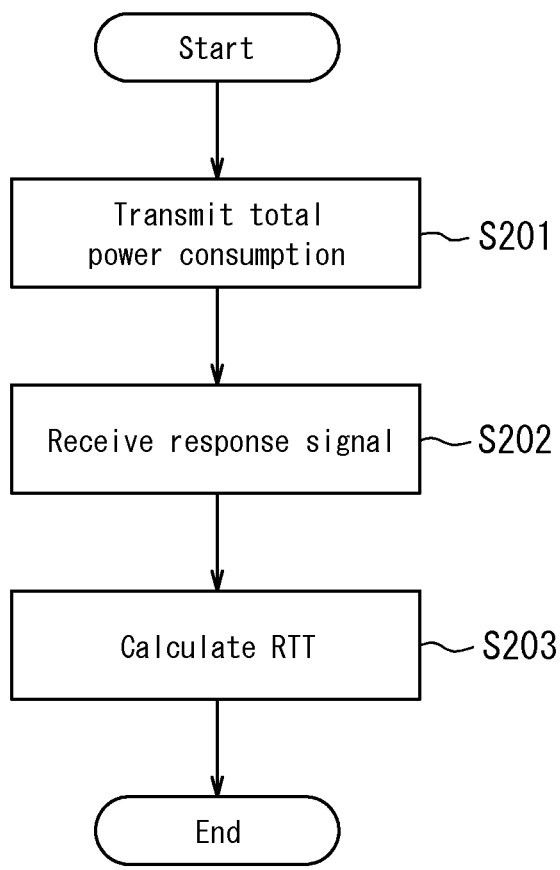
FIG. 5 is a flowchart illustrating a main data transmission operation of the transmission apparatus according to one embodiment.

First, the main data transmission operation (step S105) will be described in detail with reference to FIG. 5. FIG. 5 is a flowchart illustrating the main data transmission operation of the transmission apparatus according to one embodiment.

According to the present embodiment, the controller 127 deals with a sum of the power consumptions W1 to W6 of all of the power loads 105-1 to 105-6, i.e., the total power consumption Wd of all of the power loads 105 as the main data and controls the communication unit 125 to transmit the total power consumption Wd to the server 109 (step S201). Note that the controller 127 may acquire the total power consumption Wd from the sensor 107-1 connected to the power meter 103. The controller 127 may acquire the total power consumption Wd by summing up the power consumption W1 to W6 from the sensors 107-2 to 107-5 those connected to the power loads 105.

When the total power consumption Wd reaches the server 109, the server 109 transmits the response signal to the transmission apparatus 101. The communication unit 125 of the transmission apparatus 101 receives the response signal and transmits the response signal to the controller 127 (step S202). Then, the controller 127 calculates the RTT from transmission time of the total power consumption Wd and reception time of the response signal (step S203).

Figure 6:
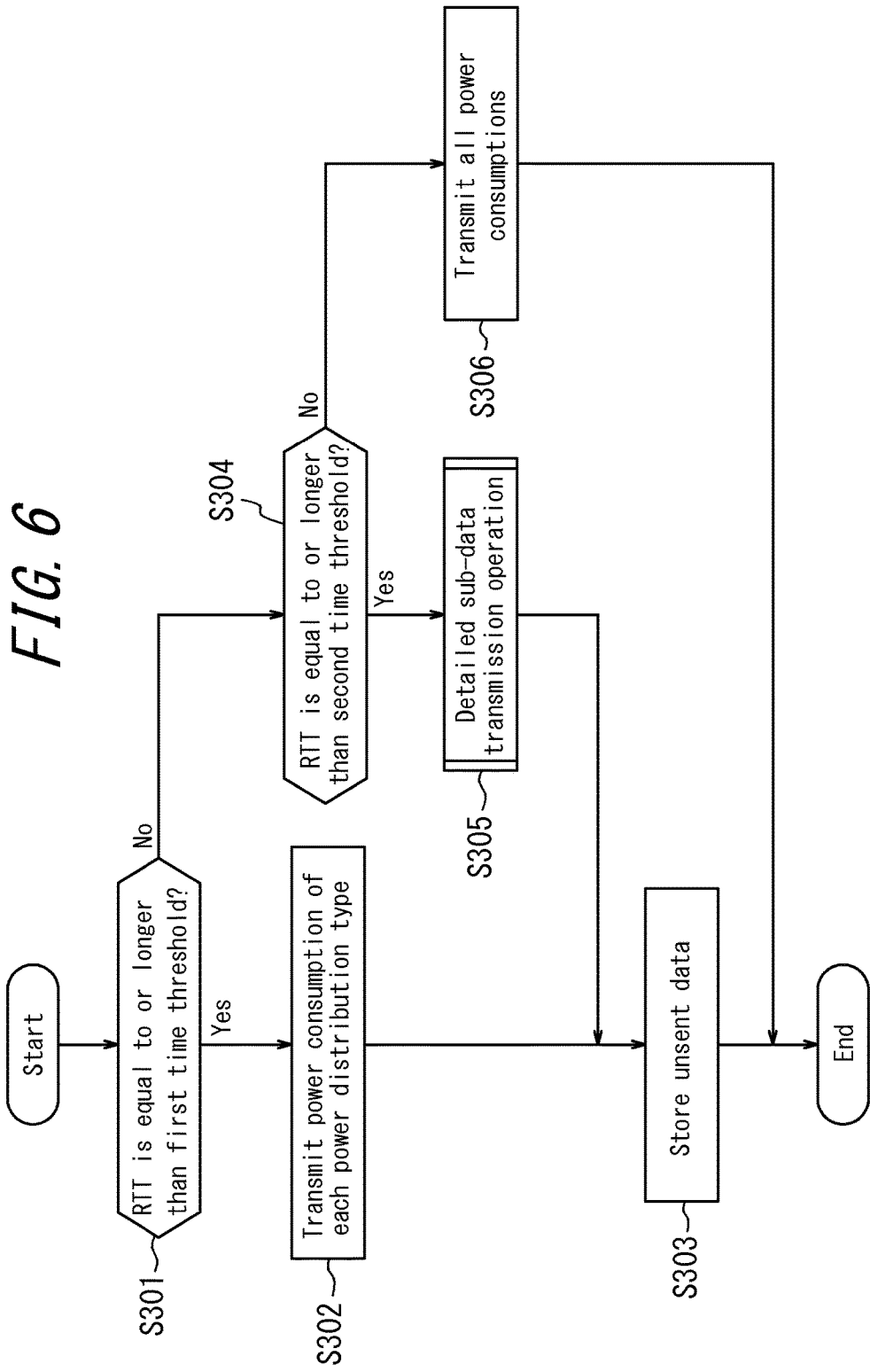
FIG. 6 is a flowchart illustrating a sub-data transmission operation of the transmission apparatus according to one embodiment.

The transmission apparatus 101, after ending the main data transmission operation, carries out the sub-data transmission operation (step S106). The sub-data transmission operation will be described in detail with reference to FIG. 6. FIG. 6 is a flowchart illustrating the sub-data transmission operation of the transmission apparatus according to one embodiment.

First, the controller 127 compares the RTT with a first time threshold (a first congestion threshold) (step S301). When the RTT is equal to or longer than the first time threshold (Yes at step S301), the controller 127, based on the power consumptions W1 to W6, calculates a power consumption of each power distribution type of each distribution system in a power gird as the sub-data. The power consumption of each power distribution type corresponds to a sum of the power consumptions of the power loads connected in each distribution system. The present embodiment assumes that, as the distribution system in the power gird, a single-phase three-wire system and a three-phase three-wire system are adopted, and also that the power loads 105-1 to 105-4 are supplied with power from the single-phase three-wire system while the power loads 105-5 and 105-6 are supplied with power from the three-phase three-wire system. Therefore, the controller 127 obtains a power consumption Wt of the single-phase three-wire system by summing up the W1, the W2, the W3, and the W4. Also, the controller 127 obtains a power consumption Ws of the three-phase three-wire system by summing up the W5 and the W6. Note that the distribution system in the power gird is not limited to the single-phase three-wire system and the three-phase three-wire system but may be, for example, a single-phase two-wire system.

Figure 7:
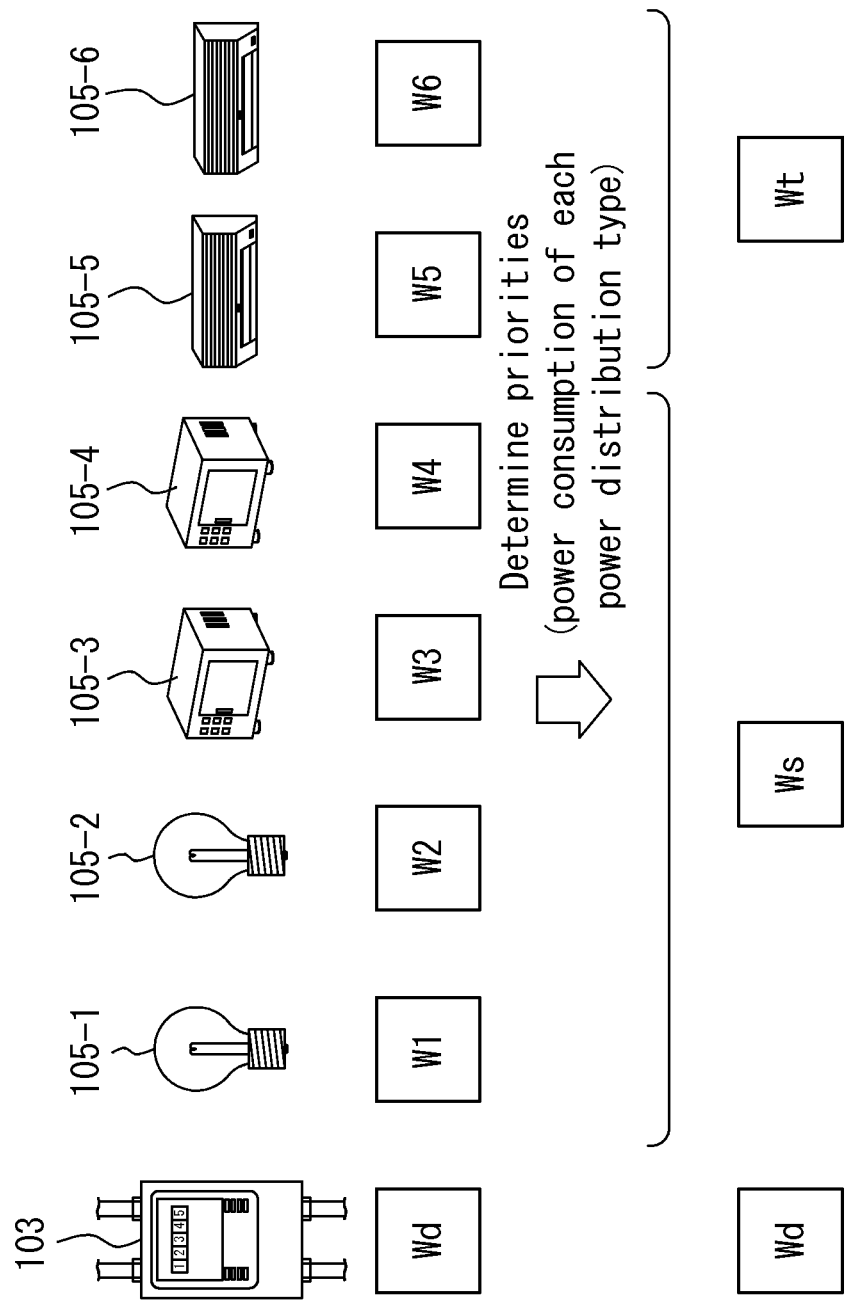
FIG. 7 is a diagram illustrating a power consumption of each power distribution type according to one embodiment.

Then, the controller 127 controls the communication unit 125 to transmit the power consumption of each power distribution type (step S302). Then, the controller 127 stores, as the unsent data, the power consumptions W1 to W6 those have not been transmitted in the storage unit 123 (step S303). That is, when the RTT is equal to or longer than the first time threshold, three power consumptions Wd, Wt, and Ws are transmitted to the server 109 as illustrated in FIG. 7.

At step S301, when the RTT is shorter than the first time threshold (No at step S301), the controller 127 compares the RTT with a second time threshold (a second congestion threshold) that is shorter than the first time threshold (step S304). When the RTT is equal to or longer than the second time threshold (Yes at step S304), the controller 27 carries out a detailed sub-data transmission operation described below (step S305). Then, the controller 127 stores, as the unsent data, the power consumption of power load that has not been transmitted in the detailed sub-data transmission operation in the storage unit 123 (step S303).

At step S304, when the RTT is shorter than the second time threshold (No at step S304), all of the power consumptions W1 to W6 of the power loads 105-1 to 105-6 are determined as the sub-data and, within the sub-data, each power consumption is given the same priority. That is, the controller 127 controls the communication unit 125 to transmit all of the power consumptions W1 to W6 in random order (step S306).

Figure 8:
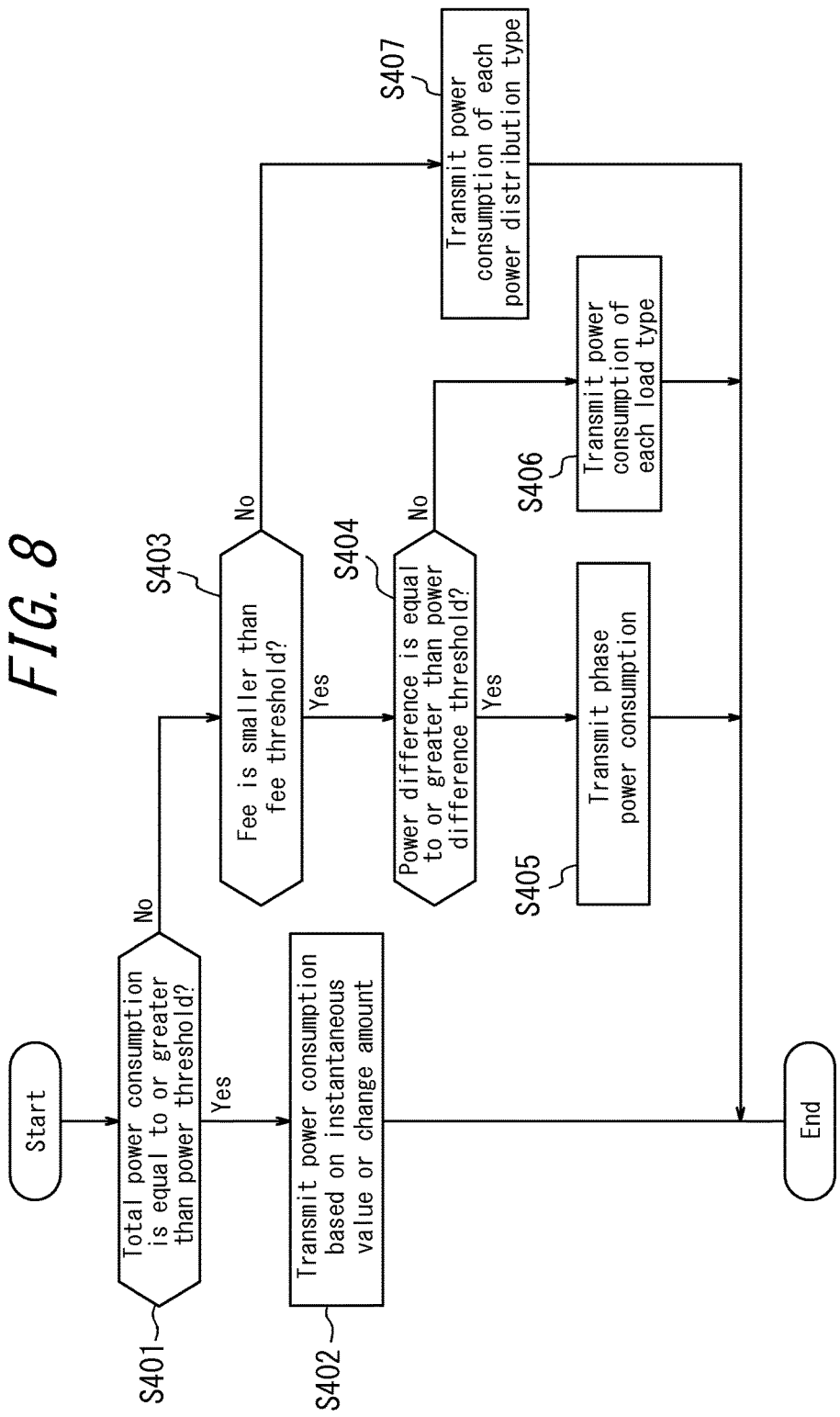
FIG. 8 is a flowchart illustrating a detailed sub-data transmission operation of the transmission apparatus according to one embodiment.

Next, the detailed sub-data transmission operation (step S305) will be described in detail with reference to FIG. 8. FIG. 8 is a flowchart illustrating the detailed sub-data transmission operation of the transmission apparatus according to one embodiment.

First, the controller 127 compares the total power consumption Wd with a power threshold (step S401). When the total power consumption is equal to or greater than the power threshold (Yes at step S401), the controller 127 deals with the power consumptions W1 to W6 of the power loads 105-1 to 105-6, respectively, as the sub-data and, within the sub-data, gives the power consumption a higher priority in proportion to an instantaneous value or a change amount thereof. The power threshold may be appropriately determined and may be set at a small value for a time slot with a higher power rate such as during the daytime in summer or a time slot in which power saving is required.

Figure 9:
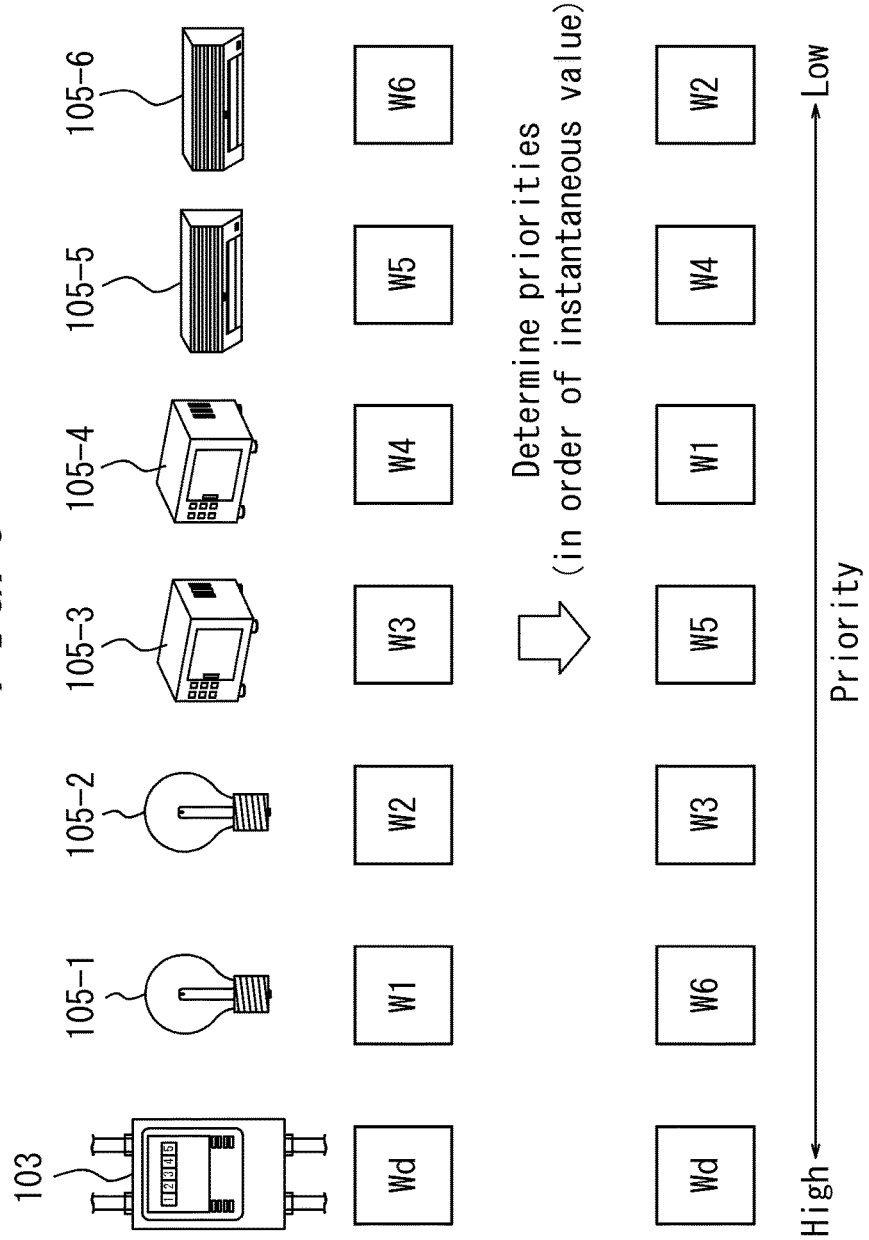
FIG. 9 is a diagram illustrating the power consumptions arranged in order of an instantaneous value according to one embodiment.
Figure 10:
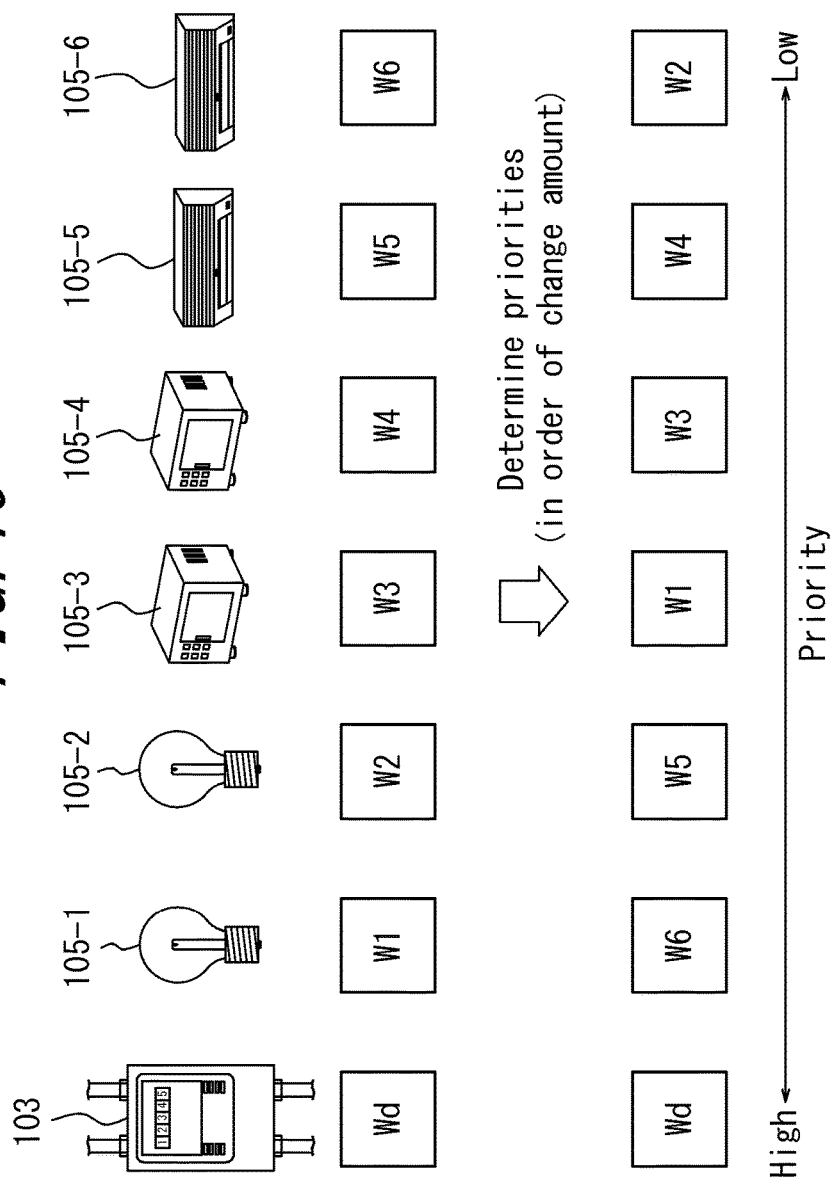
FIG. 10 is a diagram illustrating the power consumption arranged in order of a change amount according to one embodiment.

The instantaneous value corresponds to the power consumptions W1 to W6 acquired immediately before the transmission timing. Also, the change amount corresponds to a difference between the instantaneous value and a past power consumption stored in the storage unit 123, or a standard deviation or a distribution of the power consumption in a predetermined period including time of the acquisition of the instantaneous value. For example, when a size relation of the instantaneous values of the power consumptions satisfies W6>W3>W5>W1>W4>W2, as illustrated in FIG. 9, the W6, the W3, the W5, the W1, the W4, and the W2 have higher priorities in the stated order. Also, when the change amounts of the power loads 105-6, 105-5, 105-1, 105-3, 105-4, and 105-2 are stated in descending order, as illustrated in FIG. 10, the W6, the W5, the W1, the W3, the W4, and the W2 have higher priorities in the stated order.

Then, the controller 127, until next transmission timing, controls the communication unit 125 to transmit the power consumptions W1 to W6 in priority order (step S402). When the next transmission timing has come, the remaining unsent power consumption is stored as the unsent data in the storage unit 123 (step S303).

At step S401, when the total power consumption Wd is smaller than the power threshold (No at step S401), the controller 127 may compare a transmission fee of the network 111 of current time with a fee threshold (step S403). When the transmission fee is smaller than the fee threshold (Yes at step S403), the controller 127, based on the power consumption, calculates a phase power consumption of each voltage line with the same voltage to ground as the sub-data. According to the present embodiment, the voltage lines with the same voltage to ground are an R-line (100 V) and a T-line (100 V) those constituting the single-phase three-wire, and the phase power consumption of the voltage lines corresponds to a power consumption of an R-N phase and a power consumption of a T-N phase. Note that N represents a neutral line (0 V). When the power loads 105-1 to 105-3 are connected to the R-N phase and the power load 105-4 is connected to the T-N phase, the controller 127 calculates a power consumption Wrn of the R-N phase by summing up the W1, the W2 and the W3 and determines a power consumption Wtn of the T-N phase as the W4.

Figure 11:
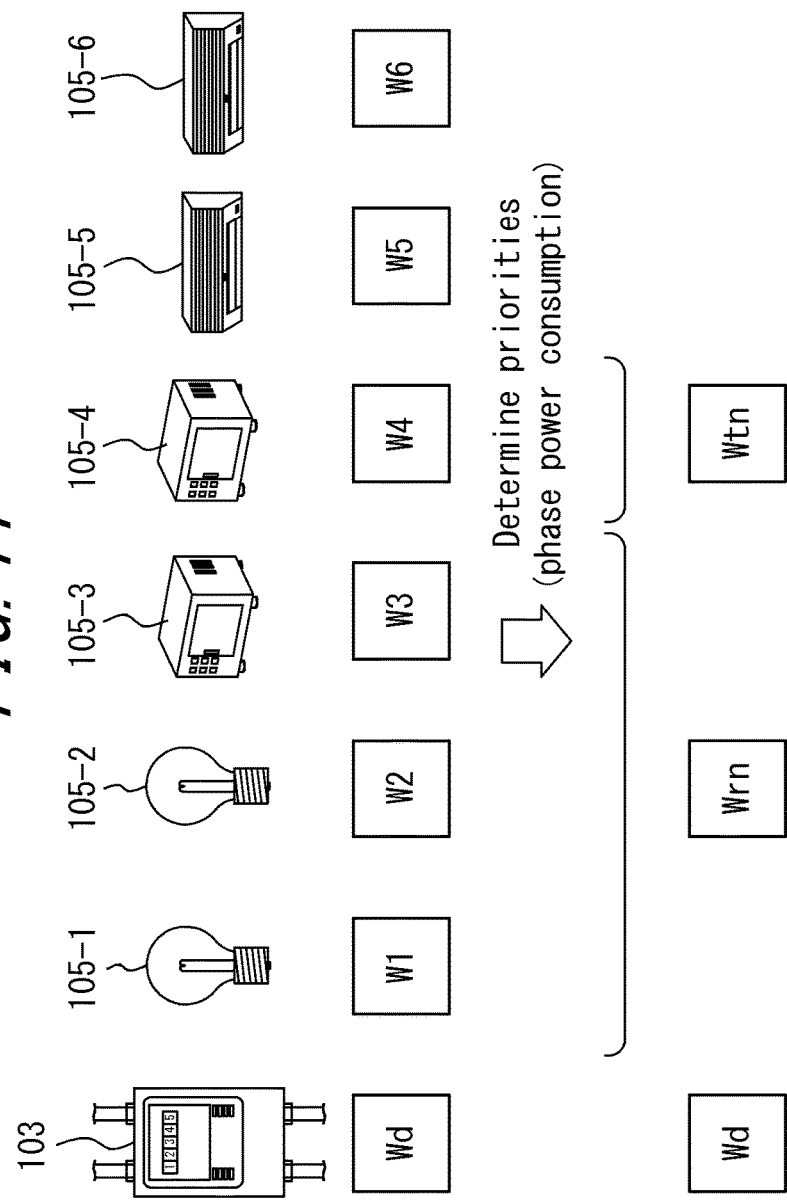
FIG. 11 is a diagram illustrating phase power consumptions according to one embodiment.

Then, the controller 127 compares a difference between the phase power consumptions (Wrn-Wtn (note that Wrn>Wtn is satisfied) with a power difference threshold (step S404). When the power difference is equal to or greater than the power difference threshold (Yes at step S404), the controller 127 controls the communication unit 125 to transmit the phase power consumptions Wrn and Wtn (step S405). That is, when the power difference between the phase power consumptions is equal to or greater than the power difference threshold, as illustrated in FIG. 11, three power consumptions Wd, Wrn, and Wtn are transmitted to the server 109. Note that the controller 127 may control the communication unit 125 to transmit, together with the phase power consumptions Wrn and Wtn, the power consumption of the R-T phase and the power consumption Ws of each power distribution type associated with the three-phase three-wire system.

At step S404, when the power difference between the phase power consumptions is smaller than the power difference threshold (No at step S404), the controller 127, based on the power consumptions W1 to W6, calculates the power consumption of each load type of each power load type as the sub-data. In the present embodiment, the power load 105-1 and the power load 105-2 are lighting equipments and thus of the same type, the power load 105-3 and the power load 105-4 are cooking equipments and thus of the same type, and the power load 105-5 and the power load 105-6 are air-conditioning equipments and thus of the same type. Note that the power load type may be preliminarily determined in an appropriate manner and may be classified into a more specific group than the cooking equipments described above (for example, a microwave) or a more general group (for example, a power load installed in a kitchen (including a fridge and the like as well as the cooking equipments)).

Therefore, the controller 127 calculates a power consumption WL of the lighting equipments by summing up the W1 and the W2, a power consumption Wc of the cooking equipments by summing up the W3 and the W4, and a power consumption Wa of the air-conditioning equipments by summing up the W5 and the W6. Then, the controller 127 gives priorities to the power consumptions WL, Wc and Wa of each load type; a higher priority in proportion to the instantaneous value thereof. For example, when the size relation of the power consumptions of each load type satisfies Wa>Wc>WL, as illustrated in FIG. 12, the Wa, the Wc, and the WL are given the higher priority in the stated order.

Then, the controller 127, until next transmission timing, controls the communication unit 125 to transmit the power consumptions Wa, Wc, and WL in priority order (step S406). At the next transmission timing, the power consumption that has not been sent is stored as the unsent data in the storage unit 123 (step S303).

At step S403, when the transmission fee is equal to or greater than the fee threshold (No at step S403), the controller 127, in a manner similar to step S302, controls the communication unit 125 to transmit the power consumption of each power distribution type (step S407).

The transmission apparatus 101, after carrying out the sub-data transmission operation (step S106) as described above, subsequently carries out the unsent data transmission operation (step S107). The unsent data transmission operation will be described in detail with reference to FIG. 13. FIG. 13 is a flowchart illustrating the unsent data transmission operation of the transmission apparatus according to one embodiment.

First, the controller 127 compares the transmission fee at the current time with the fee threshold (step S501). When the transmission fee is smaller than the fee threshold (Yes at step S501), the transmission apparatus 101, during a repeating operation at step S502, repeatingly carries out the operations at step S503 and step S504 described below until all of the unsent data stored in the storage unit 123 is transmitted.

First, the controller 127 determines whether the current time corresponds to the next transmission timing (step S503). When the current time does not correspond to the next transmission timing (No at step S503), the controller 127 controls the communication unit 125 to transmit the unsent data stored in the storage unit 123 (step S504).

When the transmission fee is equal to or greater than the fee threshold (No at step S501), or when the current time corresponds to the next transmission timing (Yes at step S503), the transmission apparatus 101 ends the unsent data transmission operation. That is, the controller 127 controls the communication unit 125 not to send the unsent data.

According to the present embodiment, as described above, the controller 127 of the transmission apparatus 101 determines the priorities of the data associated with the power consumptions Wd and W1 to W6 based on the RTT and controls the communication unit 125 to transmit the data in priority order. Thereby, the data with a high priority are highly likely to reach the server 109 before the server 109 needs the data. Accordingly, efficient transmission of the data with a high priority may be substantialized.

According to the present embodiment, also, the controller 127 may deals with the sum of the power consumptions (the total power consumption) Wd as the main data and give the highest priority thereto. The server 109 receives the total power consumption Wd before other data, and thus may first determine whether the total power consumption Wd is likely to exceed the contract demand. When the server 109 determines that the total power consumption Wd is likely to exceed the contract demand, the server 109 may instruct any one of the power loads to reduce the power consumption. Thereby, the possibility for the total power consumption Wd to exceed the contract demand may be reduced, preventing a penalty for exceeding the contract demand and an increase in the contract demand.

According to the present embodiment, also, when the RTT is equal to or longer than the first time threshold, the controller 127 calculates the power consumptions Ws and Wt of each power distribution type of each distribution system in the power gird as the sub-data and gives the sub-data the second highest priority next to the main data. Thereby, the total power consumption Wd, the power consumption Ws of a switch board, and the power consumption Wt of a lighting panel those need to be reported in order to receive the BEMS subsidy are preferentially transmitted to the server 109. Accordingly, the report for receiving the BEMS subsidy may be carried out more reliably. Additionally, since the power consumptions Ws and Wt of each power distribution type are obtained from the sum of a plurality of power consumptions, the number of the power consumptions Ws and Wt (two) of each power distribution type is less than the number of power consumptions W1 to W6 of the power loads 105-1 to 105-6 (six). Therefore, the communication fee for the transmission of the power consumption of each power distribution type is lower than the communication fee for the transmission of the power consumptions of the power loads.

According to the present embodiment, also, when the RTT is shorter than the first time threshold and longer than the second time threshold, the controller 127 may compare the total power consumption Wd with the power threshold. Then, when the total power consumption Wd is equal to or greater than the power threshold, the controller 127 may deal with the power consumptions W1 to W6 of the power loads 105-1 to 105-6 as the sub-data and give the sub-data the second highest priority next to the main data. Then, the controller 127, within the sub-data, may give priorities to the power consumptions in proportion to the instantaneous value or the change amount. Thereby, the server 109 may easily identify the power consumption with a large instantaneous value or change amount. The server 109 instructs the power load corresponding to the power consumption with the large instantaneous value or the change amount to reduce the power consumption, thereby efficiently reducing the total power consumption Wd.

According to the present embodiment, also, when the total power consumption Wd is smaller than the power threshold, the controller 127, based on the power consumption, may calculate the phase power consumptions Wrn and Wtn of the voltage lines with the same voltage to ground as the sub-data and compare the power difference between the phase power consumptions Wrn and Wtn with the power difference threshold. Then, when the power difference is equal to or greater than the power difference threshold, the controller 127 may give the sub-data the second highest priority next to the main data. Thereby, the phase power consumptions Wrn and Wtn are preferentially transmitted to the server 109, and the server 109 may know that a load imbalance is occurred between the voltage lines with the same voltage. Accordingly, the server 109 may instruct the power load to reduce the power consumption in order to redress the balance. Also, since the phase power consumptions Wrn and Wtn are obtained by summing up a plurality of power consumptions, the number of the phase power consumptions Ws and Wt (two) is less than the number of power consumptions W1 to W6 of the power loads 105-1 to 105-6 (six). Therefore, the communication fee for the transmission of the phase power consumption is lower than the communication fee for the transmission of the power consumptions of the power loads.

According to the present embodiment, also, when the power difference between the phase power consumptions Wrn and Wtn is smaller than the power difference threshold, the controller 127, based on the power consumption, may calculate the power consumptions WL, Wc, and Wa of each load type of the power load as the sub-data. Then, the controller 127 gives the sub-data the second highest priority next to the main data and, within the sub-data, gives the power consumptions priorities in proportion to the instantaneous value. Thereby, the server 109 may easily identify the type of the power load with a high power consumption. Also, since the power consumption of each load type WL, Wc, and Wa are obtained by summing up a plurality of power consumptions, the number of the power consumptions WL, Wc, and Wa (three) of each load type is less than the number of power consumptions W1 to W6 of the power loads 105-1 to 105-6 (six). Therefore, the communication fee for the transmission of the power consumption of each power distribution type is lower than the communication fee for the transmission of the power consumptions of the power loads.

According to the present embodiment, also, when the total power consumption Wd is smaller than the power threshold, the controller 127 may compare the transmission fee of the network 111 with the fee threshold. Then, when the transmission fee is equal to or greater than the fee threshold, the controller 127 calculates the power consumptions Ws and Wt of each power distribution type of each distribution system in the power gird as the sub-data and gives the sub-data the second highest priority next to the main data. That is, during a period of time assigned with a relatively high transmission fee, the transmission apparatus 101 transmits minimum data necessary in order to receive the BEMS subsidy to the server 109, thereby reducing both a power rate and the communication fee.

According to the present embodiment, also, the controller 127 may deal with the power consumptions Wd and W1 to W6 that have been obtained and different from the sub-data as the unsent data and give the unsent data the second highest priority next to the sub-data. Thereby, the transmission apparatus 101 may transmit the power consumption of each power load that has not been transmitted as the sub-data to the server 109. Thereby, the server 109 may know a transition of the power consumption of each power load.

According to the present embodiment, further, the controller 127 may compare the transmission fee of the network 111 with the fee threshold and, when the transmission fee is equal to or greater than the fee threshold, control the communication unit 125 not to transmit the unsent data. Thereby, the transmission apparatus 101 may prevent a significant increase in the communication fee due to the transmission of the unsent data in the period of time assigned with a relatively high transmission fee.

Although the present invention has been described based on the figures and the embodiment, it is to be understood that various modifications and changes may be implemented based on the present disclosure by those who are ordinarily skilled in the art. Accordingly, such modifications and changes are included in a scope of the present disclosure.

For example, a function and the like included in each unit, means, step and the like may be rearranged without logical inconsistency, so as to combine a plurality of means or steps together or to divide them.

Although in the description of the above embodiment the transmission apparatus 101 determines the data to be preferentially transmitted to the server 109, the present disclosure is not limited thereto. For example, the server may transmit, to the transmission apparatus, a signal specifying the data to be transmitted. Then, the communication unit of the transmission apparatus receives the signal, and the controller may give the data specified by the server a second highest priority next to the main data. Thereby, the transmission apparatus may efficiently transmit the data required by the server. Such specification of the data to be transmitted by the server is valid when, for example, the server wishes to check the instantaneous value, when the server wishes to identify the power load that has been forgotten to turn off, and the like. When the server wishes to identify the power load that has been forgotten to turn off, the server instructs the transmission apparatus to give a higher priority to the power consumption in proportion to the change amount thereof from the previous date. When a shop has a similar activity pattern in each day (for example, during time the shop is closed), a using pattern of the power load also becomes similar. Therefore, when a power load has power consumption at the current time and no power consumption at the same time of the previous day, it is highly likely that this power load has been forgotten to turn off.

In the description of the above embodiment, technical concepts represented by meanings of phrases such as "greater than" the threshold and "smaller than" the threshold are not restrictive but may either include or exclude the value. For example, "greater than" the threshold may mean either a comparison object reaches the threshold or the comparison object exceeds the threshold. Similarly, for example, "smaller than" the threshold may mean either the comparison object falls under the threshold or the comparison object reaches the threshold, that is, the comparison object falls down to the threshold.

REFERENCE SIGNS LIST

100 power control system
101 transmission apparatus
103 power meter
105-1 to 105-6 power load
107-1 to 107-5 sensor
109 server
111 network
121 acquisition unit
123 storage unit
125 communication unit
127 controller

The invention claimed is:

1. A transmission apparatus comprising:
at least one sensor configured to acquire data associated with a power consumption of each of a plurality of power loads;
communication hardware configured to transmit data associated with the power consumption to a server via a network; and
a controller configured to acquire a congestion degree of the network, wherein
the controller determines a priority of the data based on the congestion degree and controls the communication hardware to transmit data in priority order, and the controller deals with a total power consumption as main data and gives the main data a highest priority, and wherein
when the congestion degree is equal to or higher than a first congestion threshold, the controller, based on the power consumption, calculates a power consumption of each power distribution type of each distribution system in a power grid as sub-data, and gives the sub-data a second highest priority next to the main data.

2. The transmission apparatus according to claim 1, wherein
when the congestion degree is lower than a first congestion threshold and higher than a second congestion threshold that is smaller than the first congestion threshold, the controller
compares the total power consumption with a power threshold and, when the total power consumption is greater than the power threshold,
deals with the power consumption as the sub-data,
gives the sub-data a second highest priority next to the main data, and
within the sub-data, gives a higher propriety to the power consumption in proportion to an instantaneous value or a change amount thereof.

3. The transmission apparatus according to claim 2, wherein
when the total is less than the power threshold, the controller
based on the power consumption, calculates a phase power consumption of each voltage line with the same ground voltage as the sub-data,
compares a power difference between the phase power consumptions with a power difference threshold, and
when the power difference is equal to or greater than the power difference threshold, gives the sub-data a second highest priority next to the main data.

4. The transmission apparatus according to claim 3, wherein
when the power difference is smaller than the power difference threshold, the controller
based on the power consumption, calculates the power consumption of each load type of each power load type as the sub-data,
gives the sub-data a second highest priority next to the main data, and
within the sub-data, gives a higher priority to the power consumption of each load type in proportion to the instantaneous value thereof.

5. The transmission apparatus according to claim 2, wherein
when the total power consumption is smaller than the power threshold, the controller
compares a transmission fee of the network with a fee threshold, and
when the transmission fee is equal to or greater than the fee threshold, calculates, based on the power consumption, the power consumption of each power distribution type of each distribution system in the power gird and gives the sub-data a second highest priority next to the main data.

6. The transmission apparatus according to claim 2, wherein
when the congestion degree is lower than the second congestion threshold, the controller deals with the power consumption as the sub-data,
gives the sub-data a second highest priority next to the main data, and within the sub-data, gives each power consumption the same priority.

7. The transmission apparatus according to claim 1, wherein the controller
    deals with a power consumption different from the sub-data among the acquired power consumptions as unsent data, and
    gives the unsent data a third highest priority next to the sub-data.

8. The transmission apparatus according to claim 7, wherein the controller
    compares the transmission fee of the network with the fee threshold, and
    when the transmission fee is equal to or greater than the fee threshold, controls the communication unit not to transmit the unsent data.

9. The transmission apparatus according to claim 1, wherein
    the communication unit receives, from the server, a signal for specifying data to be transmitted by the transmission apparatus, and
    the controller gives the data to be transmitted a second highest priority next to the main data.

10. A transmission method of a transmission apparatus for transmitting data to a server via a network, the transmission method comprising:
    acquiring a power consumption of each of a plurality of power loads;
    acquiring a congestion degree of the network;
    determining a priority of the data associated with the power consumption based on the congestion degree;
    transmitting data in priority order;
    assigning a highest priority to a total power consumption as a main data;
    calculating, based on the power consumption, a power consumption of each power distribution type of each distribution system in a power grid as sub-data when the congestion degree is equal to or higher than a first congestion threshold; and
    assigning a second highest priority next to the main data to the sub-data.

* * * * *